United States Patent
Kim et al.

(10) Patent No.: US 11,495,305 B2
(45) Date of Patent: Nov. 8, 2022

(54) SEMICONDUCTOR MEMORY DEVICE AND OPERATING METHOD THEREOF

(71) Applicant: SK hynix Inc., Gyeonggi-do (KR)

(72) Inventors: Jong Woo Kim, Gyeonggi-do (KR); Young Cheol Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 125 days.

(21) Appl. No.: 17/003,402

(22) Filed: Aug. 26, 2020

(65) Prior Publication Data

US 2021/0304825 A1    Sep. 30, 2021

(30) Foreign Application Priority Data

Mar. 30, 2020 (KR) ........................ 10-2020-0038131

(51) Int. Cl.
*G11C 16/28* (2006.01)
*G11C 16/08* (2006.01)
*G11C 16/24* (2006.01)
*G11C 16/10* (2006.01)
*G11C 16/16* (2006.01)
*G11C 16/30* (2006.01)
*G11C 16/04* (2006.01)

(52) U.S. Cl.
CPC .............. *G11C 16/28* (2013.01); *G11C 16/08* (2013.01); *G11C 16/10* (2013.01); *G11C 16/16* (2013.01); *G11C 16/24* (2013.01); *G11C 16/0483* (2013.01); *G11C 16/30* (2013.01)

(58) Field of Classification Search
CPC ....................................... G11C 16/28
See application file for complete search history.

(56) References Cited

U.S. PATENT DOCUMENTS 7,430,144 B2    9/2008   Watanabe et al.
2020/0013795 A1*  1/2020   Dunga ................ G11C 7/1057

FOREIGN PATENT DOCUMENTS

KR    10-1691097    12/2016

* cited by examiner

*Primary Examiner* — Jason Lappas
(74) *Attorney, Agent, or Firm* — IP & T Group LLP

(57) ABSTRACT

A semiconductor memory device includes a memory cell array and a peripheral circuit. The memory cell array includes at least two planes. The peripheral circuit performs a memory operation on a selected plane of the at least two planes during a single plane operation and performs a dummy operation on an unselected plane of the at least two planes.

12 Claims, 13 Drawing Sheets

FIG. 11

| Set parameter | ADD | DATA | CMD Program/Read/Erase |
|---|---|---|---|

FIG. 12

| Set feature | ADD | DATA | CMD Program/Read/Erase |
|---|---|---|---|

FIG. 13

| | DUMMY PROGRAM OPERATION | DUMMY READ/VERIFY OPERATION | DUMMY ERASE OPERATION |
|---|---|---|---|
| WL | PROGRAM VOLTAGE APPLICATION | READ/VERIFY VOLTAGE APPLICATION | FLOATING |
| BL | Vcc(Inhibit) | 0V | ERASE VOLTAGE APPLICATION |
| SL | Vcc | 0V | ERASE VOLTAGE APPLICATION |

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2020-0038131, filed on Mar. 30, 2020, which is incorporated herein by reference in its entirety.

BACKGROUND

Field of Invention

One or more embodiments described herein relate to a semiconductor memory device and a method for operating a semiconductor memory device.

Description of Related Art

Technology has evolved to allow computing systems to be used virtually anywhere and anytime. Computing systems that receive ubiquitous use include portable electronic devices. Examples of portable electronic devices include mobile phones, digital cameras, and notebook computers.

One type of storage device that may serve as a main or auxiliary memory for a portable electronic device is a semiconductor memory device. Semiconductor memory devices exhibit excellent stability, durability, information access speed, and power consumption because there are no mechanical driving parts. Examples of devices that include semiconductor memory include Universal Serial Bus (USB) memories, memory cards having various interfaces, and Solid State Drives (SSDs).

Memory devices may be classified as a volatile memory devices or nonvolatile memory devices. Nonvolatile memory devices have relatively slow write and read speeds, but retain stored data even when its power supply is interrupted or shut off. Volatile memory devices lose stored data when its power supply is interrupted or shut off. Examples of memory devices include Read Only Memory (ROMs), Mask ROM (MROMs), Programmable ROM (PROMs), Electrically Programmable ROM (EPROMs), Electrically Erasable and Programmable ROM (EEPROM), flash memories, Phase-change RAMs (PRAM), Magnetic RAMs (MRAM), Resistive RAM (RRAMs), and Ferroelectric RAMs (FRAMs). By way of example, flash memories may be classified as NOR-type flash memories and NAND-type flash memories.

SUMMARY

Embodiments provide a semiconductor memory device including a plurality of planes, which has uniform operating voltage characteristics regardless of the number of selected planes, and an operating method of the semiconductor memory device.

In accordance with an aspect of the present disclosure, there is provided a semiconductor memory device including: a memory cell array including at least two planes; and a peripheral circuit configured to perform a memory operation on a selected plane of the at least two planes during a single plane operation, and to perform a dummy operation on an unselected plane of the at least two planes.

In accordance with another aspect of the present disclosure, there is provided a semiconductor memory device including: a memory cell array including a first plane and a second plane, wherein each of the first plane and the second plane includes a plurality of normal blocks and a dummy block; and a peripheral circuit configured to simultaneously perform a memory operation on a selected normal block among the plurality of normal blocks of the selected first plane and a dummy operation on the dummy block of the unselected second plane in a single plane operation, and to simultaneously perform the memory operation on the selected normal block of the first plane and a memory operation on each of selected normal blocks among the plurality of normal blocks of the second plane in a multi-plane operation.

In accordance with still another aspect of the present disclosure, there is provided a method for operating a semiconductor memory device, the method including: selecting a normal block of some planes among a plurality of planes, based on a command corresponding to a memory operation of the some planes; and simultaneously performing the memory operation on the normal block and a dummy operation on a dummy block of the other plane except the some planes among the plurality of planes.

In accordance with still another aspect of the present disclosure, there is provided a method for controlling a semiconductor memory, the method comprising: performing a memory operation on a first plane of a memory cell array; and performing a dummy operation on a second plane of the memory cell array, wherein the first plane is a selected plane and the second plane is an unselected plane and wherein at least one of the memory operation and the dummy operation are performed during a single plane operation for the memory cell array, the memory operation including one of a read operation, program operation, and an erase operation.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 11 and 12 illustrate embodiments of data segments.

FIG. 13 illustrate a dummy operation on a dummy block of an unselected plane in accordance with an embodiment.

DETAILED DESCRIPTION

The specific structural or functional description disclosed herein is merely illustrative for the purpose of describing embodiments of the present disclosure. Embodiments of the present disclosure can be implemented in various forms, and cannot be construed as limited to the embodiments set forth herein.

Hereinafter, various embodiments of the present disclosure will be described in detail with reference to the accompanying drawings in order for those skilled in the art to be able to readily implement the technical spirit of the present disclosure.

Figure 1:
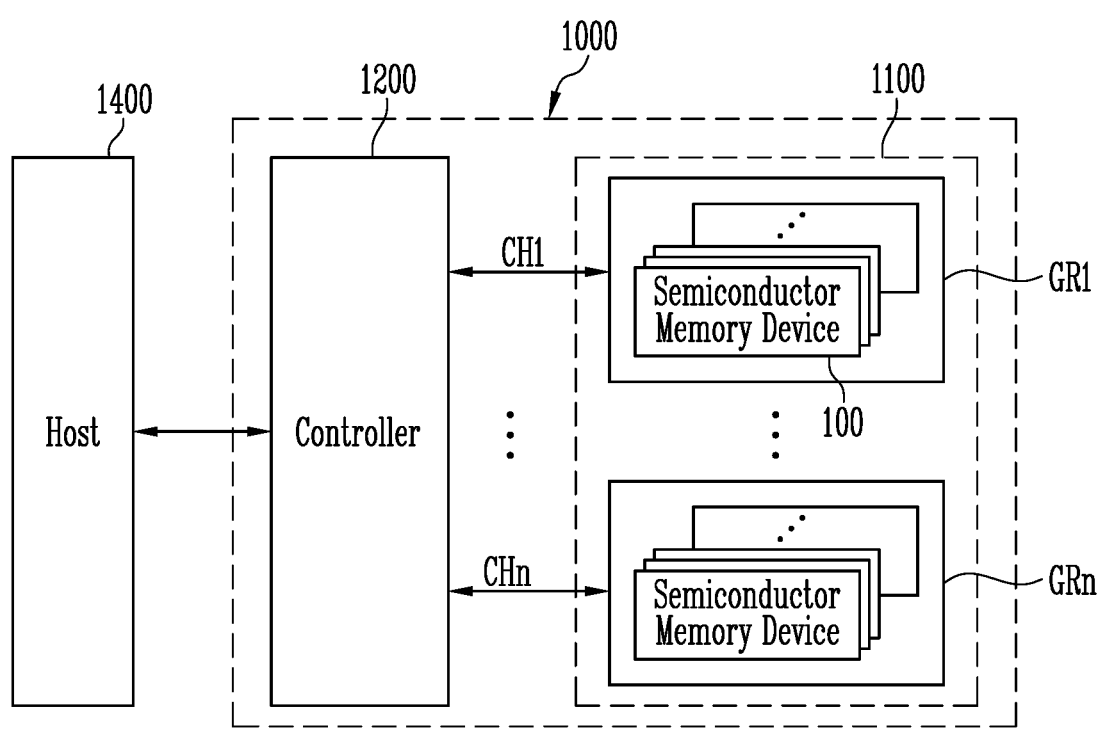
FIG. 1 illustrates an embodiment of a memory system.

FIG. 1 illustrates an embodiment of a memory system 1000 which includes a memory device 1100 and a controller 1200. The memory device 1100 includes a plurality of semiconductor memory devices 100, which may be divided into a plurality of groups GR1 to GRn. In this embodiment, the plurality of groups GR1 to GRn communicate with the controller 1200 through first to nth channels CH1 to CHn, respectively. Embodiments of the semiconductor memory devices 100 will be described, for example, with reference to FIG. 2.

Each of the groups GR1 to GRn communicates with the controller 1200 through a respective one of the channels. The controller 1200 controls the plurality of semiconductor memory devices 100 of the memory device 1100 through the plurality of channels CH1 to CHn. Each of the semiconductor memory devices 100 may include a plurality of planes including a plurality of memory blocks. The semiconductor memory devices 100 may perform a single plane operation of selecting one plane among the plurality of planes and operating the selected plane, and a multi-plane operation of simultaneously selecting the plurality of planes and operating the selected planes. In the multi-plane operation, operation periods of two or more selected planes may overlap with each other.

In accordance with an embodiment, the semiconductor memory devices 100 may control a dummy operation to be performed on dummy blocks included in unselected planes in the single plane operation. Therefore, in one embodiment, the semiconductor memory devices 100 may have similar operating voltage characteristics in the single plane operation and the multi-plane operation.

The controller 1200 is coupled between a host 1400 and the memory device 1100. The controller 1200 accesses the memory device 1100 in response to a request from the host 1400. For example, the controller 1200 may control various operations such as read, write, erase, and background operations of the memory device 1100 in response to a request received from the host 1400. The controller 1200 may serve as an interface between the memory device 1100 and the host 1400, and may drive firmware or other instructions for controlling the memory device 1100.

The host 1400 controls the memory system 1000 and may include portable electronic devices such as a computer, a PDA, a PMP, an MP3 player, a camera, a camcorder, and a mobile phone. The host 1400 may request various operations, for example, a write operation, a read operation, an erase operation, and/or other operations of the memory system 1000 through one or more corresponding commands.

In one embodiment, the controller 1200 and the memory device 1100 may be integrated into one semiconductor device. For example, the controller 1200 and the memory device 1100 may be integrated into one semiconductor device to constitute a memory card. Examples include a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

In one embodiment, the controller 1200 and the memory device 1100 may be integrated into one semiconductor device to constitute a semiconductor drive (Solid State Drive (SSD)). The semiconductor drive SSD includes a storage device configured to store data in a semiconductor memory. When the memory system 1000 is used as the semiconductor drive (SDD), the operating speed of the host 1400 coupled to the memory system 1000 may be remarkably improved.

In one embodiment, the memory system 1000 may be provided as one of various components of an electronic device. Examples include a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

The memory device 1100 or the memory system 1000 may be packaged in various forms. Examples include Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
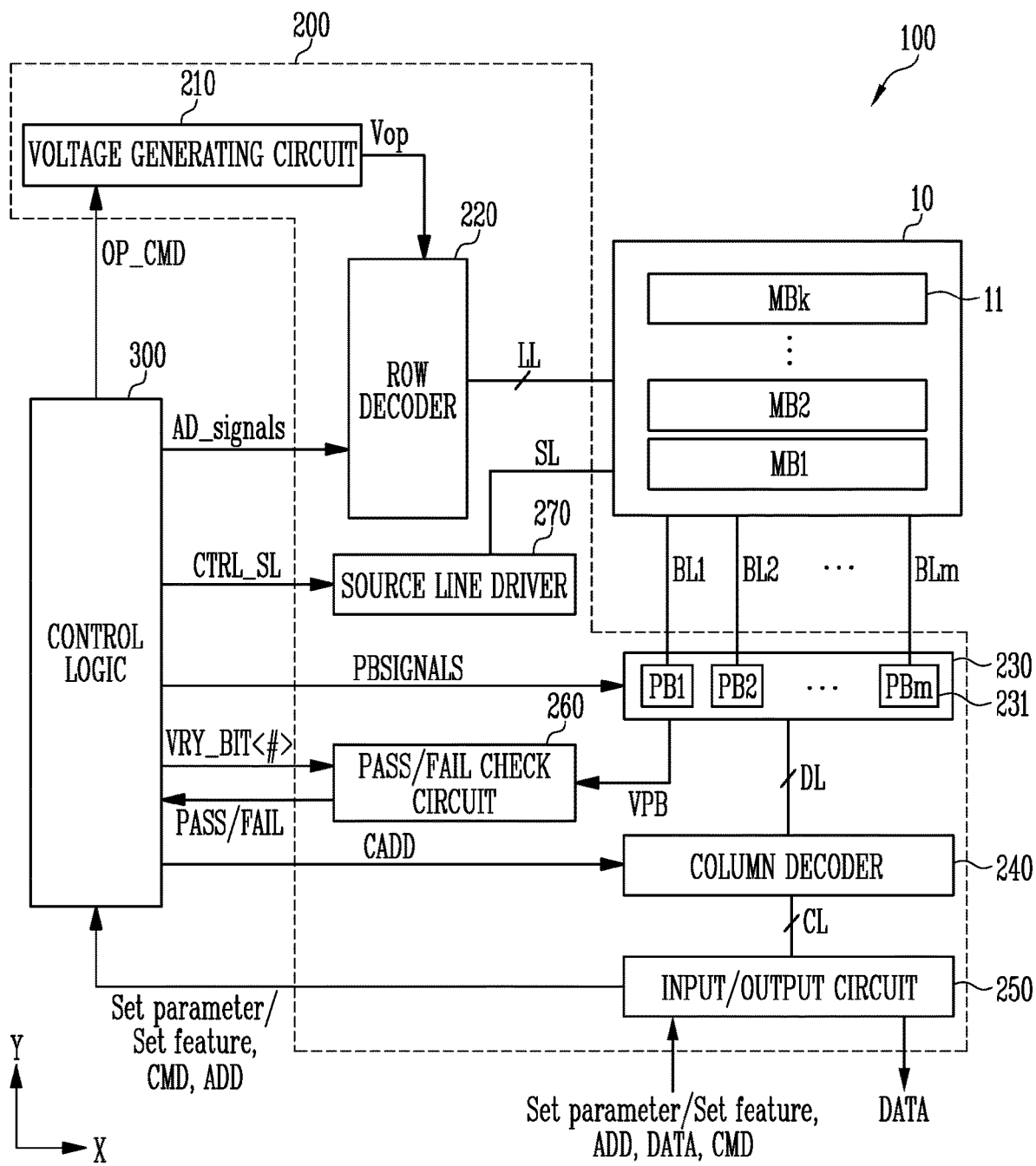
FIG. 2 illustrates an embodiment of a semiconductor memory device.

FIG. 2 illustrates an embodiment of semiconductor memory device 100 shown in FIG. 1. Referring to FIG. 2, the semiconductor memory device 100 may include a memory cell array 10 which stores data. The semiconductor memory device 100 may include peripheral circuits 200 configured to perform a program operation for storing data in the memory cell array 10, a read operation for outputting stored data, and an erase operation for erasing stored data. The program operation, the read operation, or the erase operation may be defined as a general operation or a memory operation.

The semiconductor memory device 100 may include control logic 300 which controls the peripheral circuits 200 under the control of the controller (e.g., 1200 in FIG. 1). The control logic 300 may control the peripheral circuits 200 to perform a single plane operation or a multi-plane operation in response to a set parameter or a set feature, which is received from the controller (e.g., 1200 in FIG. 1). In a general operation on a selected memory block included in a selected plane in the single plane operation, the control logic 300 may control the peripheral circuits 200 to perform a dummy operation on a dummy block included in an unselected plane together with the general operation.

The memory cell array 10 may include a plurality of memory blocks MB1 to MBk 11 (k is a positive integer). Local lines LL and bit lines BL1 to BLm (m is a positive integer) may be coupled to the memory blocks MB1 to MBk 11. For example, the local lines LL may include a first select line, a second select line, and a plurality of word lines arranged between the first and second select lines. Also, the local lines LL may include dummy lines arranged between the first select line and the word lines and between the second select line and the word lines. The first select line may be a source select line, and the second select line may be a drain select line. For example, the local lines LL may include word lines, drain and source select lines, and source lines SL. In one embodiment, the local lines LL may further include dummy lines. For example, the local lines LL may further include pipe lines.

The local lines LL may be coupled to the memory blocks MB1 to MBk 11, respectively. The bit lines BL1 to BLm may be commonly coupled to the memory blocks MB1 to MBk 11. The memory blocks MB1 to MBk 11 may be implemented in a two-dimensional or three-dimensional structure. In one example, memory cells may be arranged in a direction parallel to a substrate in memory blocks 11 having a two-dimensional structure. In another example, memory cells may be arranged in a direction vertical to a substrate in memory blocks 11 having a three-dimensional structure.

The memory cell array 10 may include at least two planes. An example that includes at least two planes will be described with reference to FIG. 3.

The peripheral circuits 200 may be configured to perform various operations such as program, read, and erase operations on a selected memory block 11 under the control of the control logic 300. For example, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, a pass voltage, and a select transistor operation voltage under the control of the control logic 300.

The row decoder 220 may transfer the operating voltages Vop to local lines LL coupled to the selected memory block 11 in response to row decoder control signals AD_signals. For example, the row decoder 220 may selectively apply operation voltages (e.g., a program voltage, a verify voltage, a read voltage, a pass voltage, and the like) generated by the voltage generating circuit 210 to word lines, among the local lines LL, in response to the row decoder control signals AD_signals.

For example, in a program voltage applying operation, the row decoder 220 may apply a program voltage generated by the voltage generating circuit 210 to a selected word line among the local lines LL in response to the row decoder control signals AD_signals and may apply a pass voltage generated by the voltage generating circuit 210 to the other unselected word lines. In a read operation, the row decoder 220 may apply a read voltage generated by the voltage generating circuit 210 to a selected word line among the logical lines LL in response to the row decoder control signals AD_signals and may apply a pass voltage generated by the voltage generating circuit 210 to the other unselected word lines.

The row decoder 220 may control word lines of a dummy block included in an unselected plane in a single plane operation. For example, the row decoder 220 may apply a program voltage to the word lines of the dummy block included in the unselected plane in a program operation on a selected memory block of a selected plane during the single plane operation. For example, the row decoder 220 may apply a read voltage to the word lines of the dummy block of the unselected plane in a read operation on the selected memory block of the selected plane during the single plane operation. For example, the row decoder 220 may float the word lines of the dummy block of the unselected plane in an erase operation on the selected memory block of the selected plane during the single plane operation.

The page buffer group 230 may include a plurality of page buffers PB1 to PBm 231 coupled to the bit lines BL1 to BLm. The page buffers PB1 to PBm 231 may operate in response to page buffer control signals PBSIGNALS. For example, the page buffers PB1 to PBm 231 may temporarily store data to be programmed in a program operation, or may sense voltages or currents of the bit lines BL1 to BLm in a read or verify operation. Also, the page buffers PB1 to PBm 231 may float the bit lines BL1 to BLm or apply an erase voltage to the bit lines BL1 to BLm in an erase operation.

Also, the page buffers PB1 to PBm 231 may control bit lines BL1 to BLm of a dummy block included in an unselected plane in a single plane operation. For example, during the single plane operation, the page buffers PB1 to PBm 231 may apply a program inhibit voltage (e.g., a power voltage Vcc) to the bit lines BL1 to BLm of the dummy block in the unselected plane in a program operation on a selected memory block of a selected plane. For example, during the single plane operation, the page buffers PB1 to PBm 231 may apply a ground voltage (e.g., 0V) to the bit lines BL1 to BLm in the unselected plane in a read operation on the selected memory block of the selected plane. In one case, during the single plane operation, the page buffers PB1 to PBm 231 may float the bit lines BL1 to BLm of the dummy block in the unselected plane or apply an erase voltage to the bit lines BL1 to BLm of the dummy block in the unselected plane in an erase operation on the selected memory block of the selected plane.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer, to the control logic 300, a set parameter or set feature, a command CMD, and an address ADD received from the controller (e.g., 1200 in FIG. 1). Also, the input/output circuit 250 may exchange data DATA with the column decoder 240.

In a verify operation, the pass/fail check circuit 260 may generate a reference current in response to an allow bit VRY_BIT<#> and may generate a pass signal PASS or a fail signal FAIL by comparing a sensing voltage VPB received from the page buffer group 230 with a reference voltage generated by the reference current. Also, in one embodiment, the pass/fail check circuit 260 may always generate and output, as the pass signal PASS, a pass/fail signal PASS/FAIL corresponding to an unselected plane in a single plane operation.

The source line driver 270 may be coupled to a memory cell included in the memory cell array 10 through a source line SL and may control a voltage applied to the source line SL. The source line driver 270 may receive a source line control signal CTRL_SL from the control logic 300 and may control a source line voltage (e.g., an erase voltage) applied to the source line SL based on the source line control signal CTRL_SL.

Also, the source line driver 270 may control a source line SL of a dummy block in an unselected plane in a single plane operation. For example, during the single plane operation, the source line driver 270 may apply a power voltage Vcc to the source line of the dummy block in the unselected plane in a program operation on a selected memory block of a selected plane. For example, the source line driver 270 may apply a ground voltage (e.g., 0V) to the source line included in the unselected plane in a read operation on the selected memory block of the selected plane during the single plane operation. In one embodiment, during the single plane operation, the source line driver 270 may apply an erase voltage to the source line SL of the dummy block in the unselected plane in an erase operation on the selected memory block of the selected plane.

The control logic 300 may control the peripheral circuits 200 to perform an operation (e.g., a program operation, a read operation, an erase operation, etc.) by outputting the operation signal OP_CMD, the row decoder control signals AD_signals, the page buffer control signals PBSIGNALS, the source line control signal CTRL_SL, and the allow bit VRY_BIT<#> in response to the command CMD and the address ADD. Also, the control logic 300 may control the peripheral circuits 200 such that the semiconductor memory device 100 operates in single plane operation or multi-plane operation in response to the set parameter or the set feature. Also, in the single plane operation, the control logic 300 may control the peripheral circuits 200 to perform a dummy operation on a dummy block included in an unselected plane.

Figure 3:
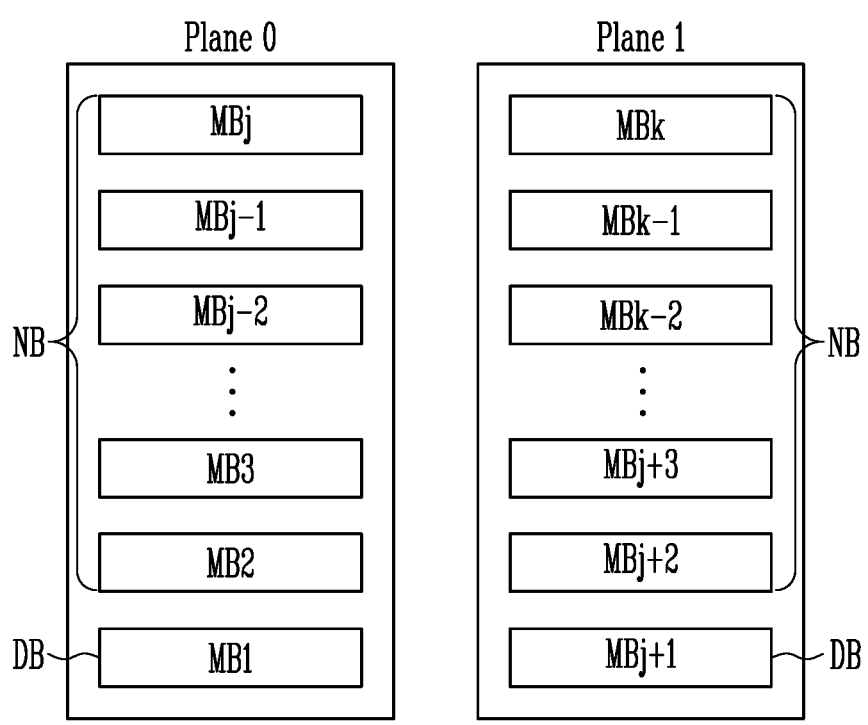
FIG. 3 illustrates an embodiment of a memory cell array.

FIG. 3 illustrates an embodiment of the memory cell array 10, which may include at least two planes: a first plane Plane 0 and a second plane Plane 1. The memory cell array 10 may include a different number of planes (e.g., four or more planes) in another embodiment.

The first plane Plane 0 may include a plurality of memory blocks MB1 to MBj. At least one memory block MB1 among the plurality of memory blocks MB1 to MBj may be defined as a dummy block DB. The other memory blocks MB2 to MBj may be defined as normal blocks.

The second plane Plane 1 may include a plurality of memory blocks MBj+1 to MBk. At least one memory block MBj+1 among the plurality of memory blocks MBj+1 may be defined as a dummy block DB. The other memory blocks MBj+2 to MBk may be defined as normal blocks. In an embodiment, the first plane Plane 0 and the second plane Plane 1 may include the same number of memory blocks. The first plane Plane 0 and the second plane Plane 1 may be adjacent to each other.

The normal blocks MB2 to MBj in the first plane Plane 0 and the normal blocks MBj+2 to MBk in the second plane Plane 1 are memory blocks selected in a normal operation of the semiconductor memory device to have a program operation, a read operation, or an erase operation to be performed thereon.

A dummy operation is performed on the dummy block MB1 in the first plane Plane 0 in a single plane operation on the second plane Plane 1. For example, the dummy operation may be performed on the dummy block MB1 of the first plane Plane 0 in an operation on a selected memory block of the second plane Plane 1. A dummy operation may be performed on the dummy block MBj+1 in the second plane Plane 1 in a single plane operation on the first plane Plane 0. For example, the dummy operation is performed on the dummy block MBj+1 of the second plane Plane 1 in an operation on a selected memory block of the first plane Plane 0.

Figure 4:
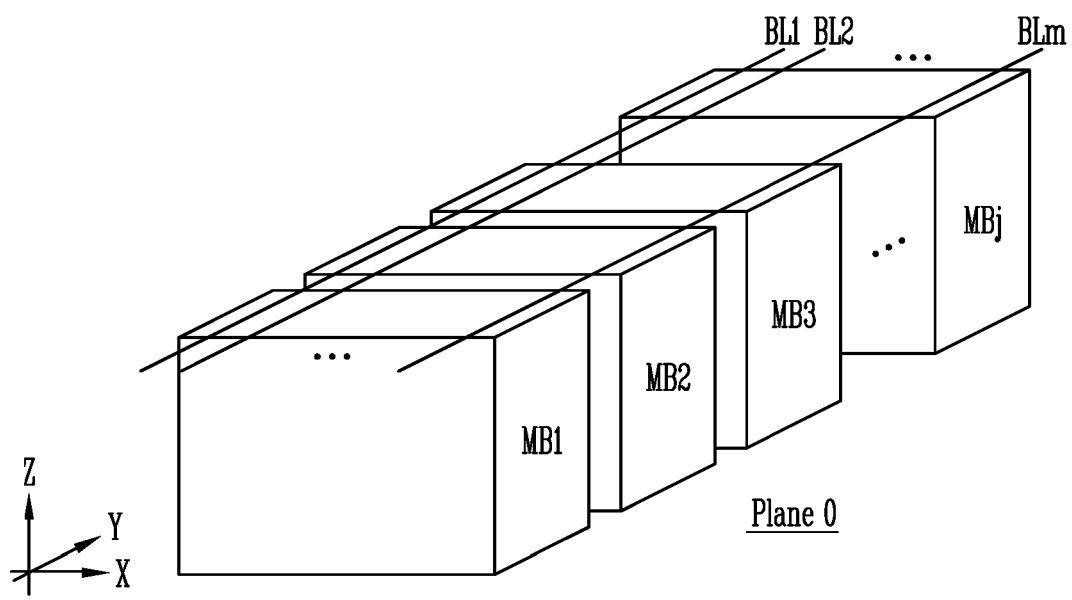
FIG. 4 illustrates an embodiment of memory blocks included in a first plane.

FIG. 4 illustrates an embodiment of the memory blocks included in a first plane Plane 0 shown in FIG. 3. The memory blocks in the first plane Plane 0 and the second plane Plane 1 (e.g., shown in FIG. 3) may have the same structure. The structure of the first plane Plane 0 will be described as a representative example.

Referring to FIG. 4, the plurality of memory blocks MB1 to MBj in the first plane Plane 0 may be spaced apart from each other along a direction Y, in which bit lines BL1 to BLm extend. For example, first to jth memory blocks MB1 to MBj may be spaced apart from each other along a second direction Y and may include a plurality of memory cells stacked along a third direction Z. An example of the configuration of one or more of the first to jth memory blocks MB1 to MBj will be described with reference to FIGS. 5 and 6.

Figure 5:
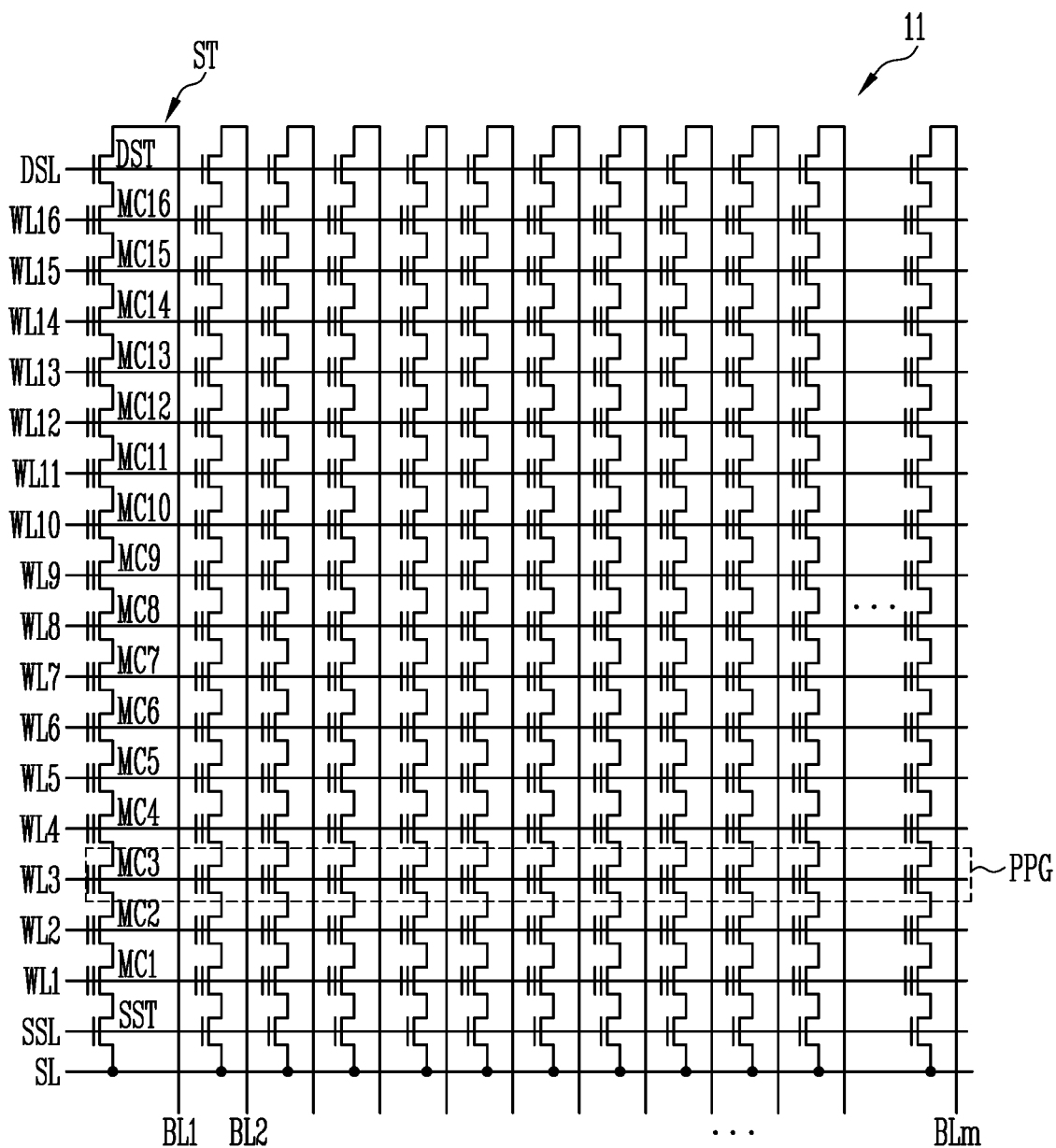
FIG. 5 illustrates an embodiment of a memory block.

FIG. 5 illustrates an embodiment of a memory block 11 which may be representative of the memory blocks shown in FIG. 4. Referring to FIG. 5, in memory block 11, a plurality of word lines WL1 to WL16 arranged in parallel to one another may be coupled between a first select line and a second select line. The first select line may be a source select line SSL, and the second select line may be a drain select line DSL. In one example, the memory block 11 may include a plurality of strings ST coupled between bit lines BL1 to BLm and a source line SL. The bit lines BL1 to BLm may be coupled to the strings ST respectively, and the source line SL may be commonly coupled to the strings ST. The strings ST may be configured identically to one another. Therefore, a string ST coupled to a first bit line BL1 will be described in detail as an example.

The string ST may include a source select transistor SST, a plurality of memory cells MC1 to MC16, and a drain select transistor DST, which are coupled in series between the source line SL and the first bit line BL1. At least one source select transistor SST and at least one drain select transistor DST may be included in one string ST. In one embodiment, a number of memory cells may be included which is greater than the number of memory cells MC1 to MC16 may be in the one string ST.

The select transistor SST may have a source coupled to the source line SL, and the drain select transistor DST may have a drain coupled to the first bit line BL1. The memory cells MC1 to MC16 may be coupled in series between the source select transistor SST and the drain select transistor DST. Gates of source select transistors SST in different strings ST may be coupled to the source select line SSL, gates of drain select transistors DST in different strings ST may be coupled to the drain select line DSL, and gates of the memory cells MC1 to MC16 in different strings ST may be coupled to the plurality of word lines WL1 to WL16. A group of memory cells coupled to the same word line among the memory cells in different strings ST may be referred as a physical page PPG. Therefore, physical pages PPG of which number corresponds to that of the word lines WL1 to WL16 may be included in the memory block 11.

One memory cell may store data of one bit and thus may be referred to as a single level cell (SLC). One physical page PPG may store one logical page (LPG) data. One LPG data may include data bits corresponding to a number of cells in one physical page PPG. In addition, one memory cell may store data of two or more bits and thus may be referred to as a multi-level cell (MLC). One physical page PPG may store two or more LPG data.

Figure 6:
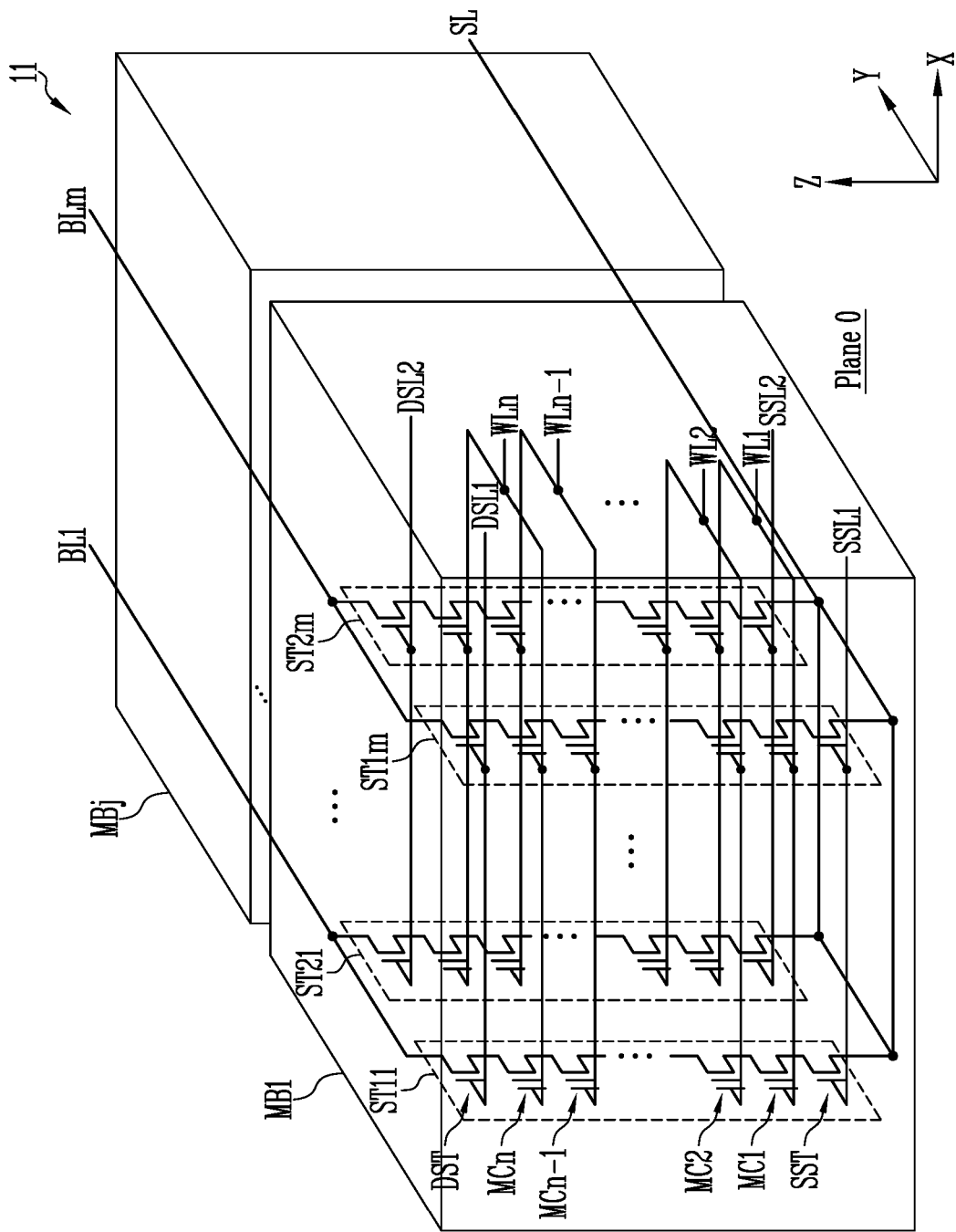
FIG. 6 illustrates an embodiment of a three-dimensional memory block.

FIG. 6 illustrates an embodiment of a three-dimensionally configured memory block. Referring to FIG. 6, the first plane Plane 0 may include a plurality of memory blocks MB1 to MBj 11. Each of the memory blocks 11 may include a plurality of strings ST11 to ST1$m$ and ST21 to ST2$m$. Each of the plurality of strings ST11 to ST1$m$ and ST21 to ST2$m$ may extend along a vertical direction (Z direction). In the memory block 11, m strings may be arranged in a row direction (X direction). Although a case where two strings are arranged in a column direction (Y direction) is illustrated in FIG. 6, a different number (e.g., three or more strings) may be arranged in the column direction (Y direction) in one embodiment.

Each of the plurality of strings ST11 to ST1$m$ and ST21 to ST2$m$ may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged on the same row may be coupled to the same source select line. Source select transistors of strings ST11 to ST1$m$ arranged on a first row may be coupled to a first source select line SSL1. Source select transistors of strings ST21 to ST2$m$ arranged on a second row may be coupled to a second source select line SSL2. In one embodiment, the source select transistors of the strings ST11 to ST1$m$ and ST21 to ST2$m$ may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. In this case, the voltage or current of a corresponding string can be stably controlled. Accordingly, reliability of data stored in the memory block 11 can be improved.

The drain select transistor DST of each string may be coupled between a bit line and the memory cells MC1 to MCn. Drain select transistors DST of strings arranged in the row direction may be coupled to a drain select line extending in the row direction. Drain select transistors DST of the strings ST11 to ST1$m$ arranged on the first row may be coupled to a first drain select line DSL1. Drain select transistors DST of the strings ST21 to ST2$m$ arranged on the second row may be coupled to a second drain select line DSL2.

In the plurality of memory blocks MB1 to MBk, one memory block may share the word lines WL1 to WLn with another memory block. The memory blocks sharing the word lines WL1 and WLn may be considered to be a shared memory block.

Figure 7:
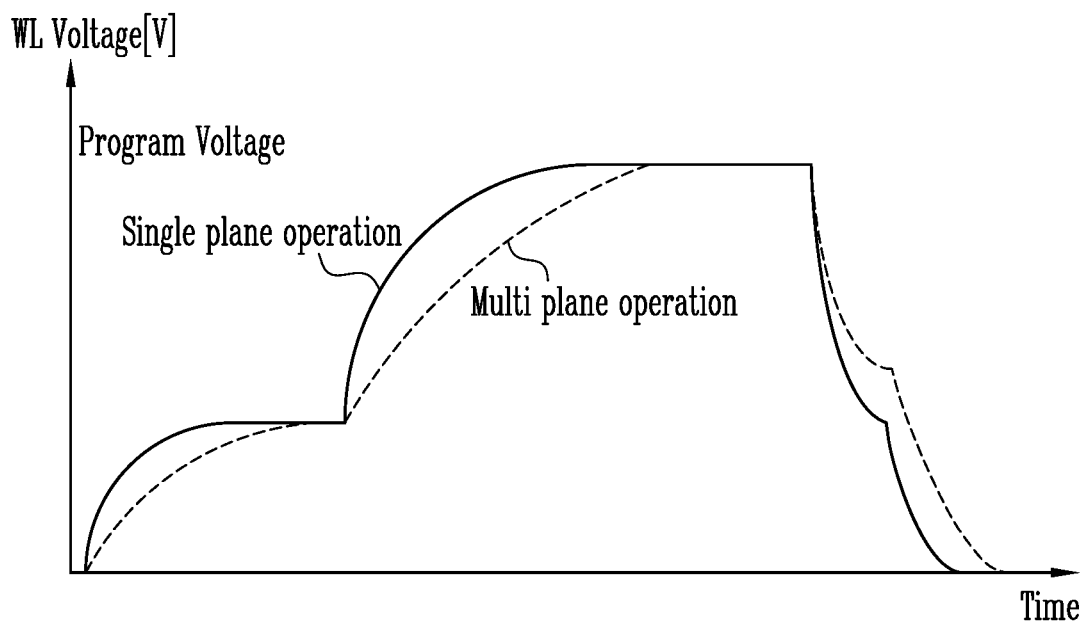
FIGS. 7 to 9 illustrate embodiments of voltage waveforms indicative of operating voltage characteristics in a single plane operation and a multi-plane operation.
Figure 8:
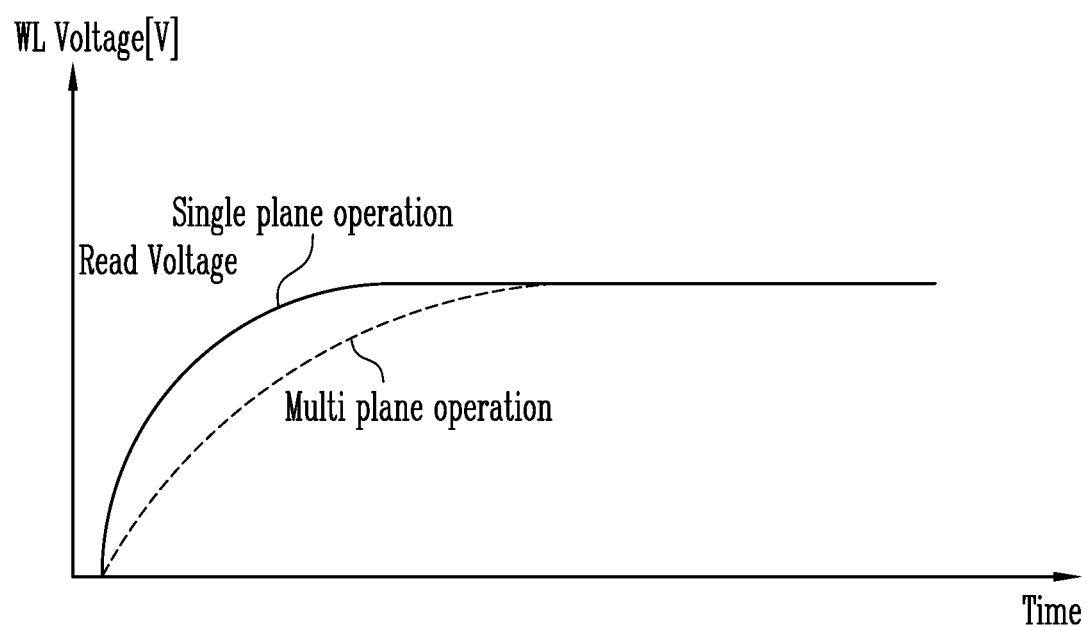
Figure 9:
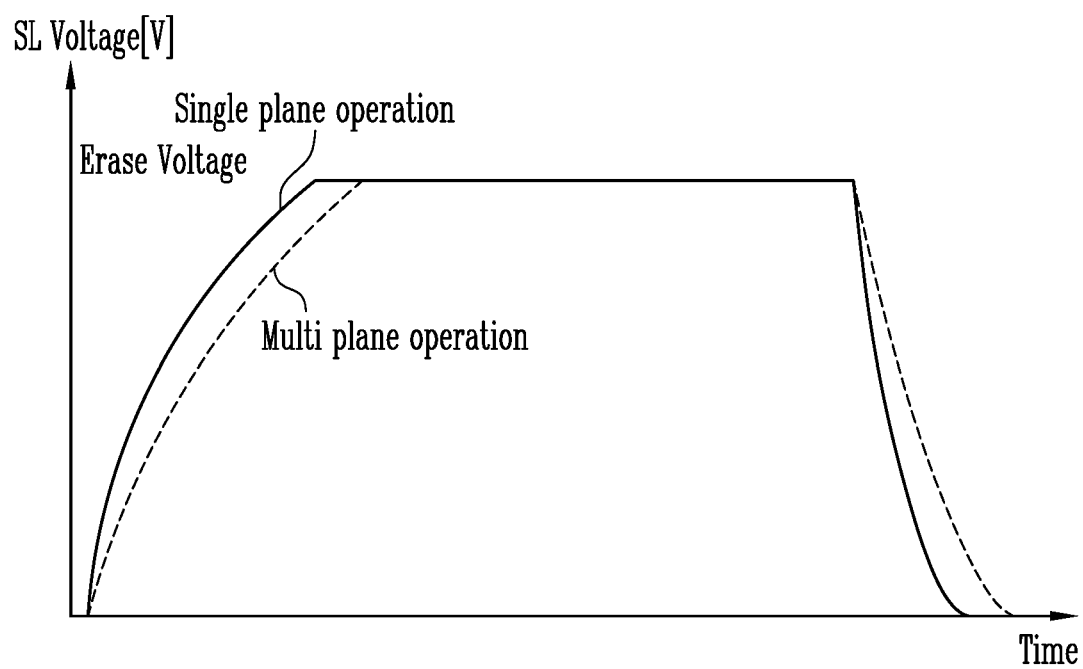

FIGS. 7 to 9 illustrate embodiments of voltage waveform diagrams that indicate differences between operating voltage characteristics in a single plane operation and a multi-plane operation. In one or more of these embodiments, a plurality of planes may share the voltage generating circuit 210 and the row decoder 220, as shown in FIG. 2. Accordingly, each of the plurality of planes receives an operating voltage Vop generated by the voltage generating circuit 210 through the row decoder 220 in a program operation and a read operation.

FIG. 7 illustrates a first curve corresponding to a single plane operation of selecting one plane among a plurality of planes and then performing operations on the selected plane. In this case, a program voltage generated by the voltage generating circuit 210 may be provided to only a selected memory block of the selected plane. FIG. 7 also includes a second curve corresponding to a multi-plane operation of simultaneously selecting a plurality of planes and then performing operations on the selected planes. In this case, the program voltage generated by the voltage generating circuit 210 may be provided to selected memory blocks of each of the plurality of selected planes.

Therefore, the loading value for word lines of the selected memory blocks in the multi-plane operation may be relatively greater than the loading value for word lines of the selected memory block in the single plane operation. As a result, the time for the program voltage to reach a target level in multi-plane operation may be longer than the time for which the program voltage to reach the target level in the single plane operation. Accordingly, program operation characteristics in single plane operation and multi-plane operation may be different from each other.

FIG. 8 illustrates a first curve corresponding to a single plane operation of selecting one plane among a plurality of planes and then performing operations on the selected plane. In this case, a read voltage generated by the voltage generating circuit 210 is provided to only a selected memory block of the selected plane. FIG. 8 also includes a second curve corresponding to a multi-plane operation of simultaneously selecting a plurality of planes and then performing operations on the selected planes. In this case, the read voltage generated by the voltage generating circuit 210 is provided to selected memory blocks of each of the plurality of selected planes.

Therefore, the loading value for word lines of the selected memory blocks in the multi-plane operation may be relatively greater than the loading value for word lines of the selected memory block in the single plane operation. As a result, the time for the read voltage to reach a target level in multi-plane operation is longer than the time for the read voltage to reach the target level in the single plane operation. Accordingly, read operation characteristics in single plane operation and multi-plane operation may be different from each other.

In one embodiment, a plurality of planes may share the source line driver 270 shown in FIG. 2. Accordingly, each of the plurality of planes may receive an erase voltage generated by the source line driver 270 in an erase operation through a source line SL.

FIG. 9 includes a first curve corresponding to a single plane operation of selecting one plane among a plurality of planes and then operating the selected plane. In this case, an erase voltage generated by the source line driver 270 is provided to only a selected memory block of the selected plane. FIG. 9 includes a second curve corresponding to a multi-plane operation of simultaneously selecting a plurality of planes and operating the selected planes. In this case, the erase voltage generated by the source line driver 270 is provided to selected memory blocks of each of the plurality of selected planes.

Therefore, the loading value for source lines SL of the selected memory blocks in multi-plane operation may be relatively greater than the loading value for a source line SL of the selected memory block in the single plane operation. As a result, the time for the erase voltage to reach a target level in the multi-plane operation may be longer than the time for the erase voltage to reach the target level in the single plane operation. Accordingly, erase operation characteristics in single plane operation and multi-plane operation may be different from each other.

Figure 10:
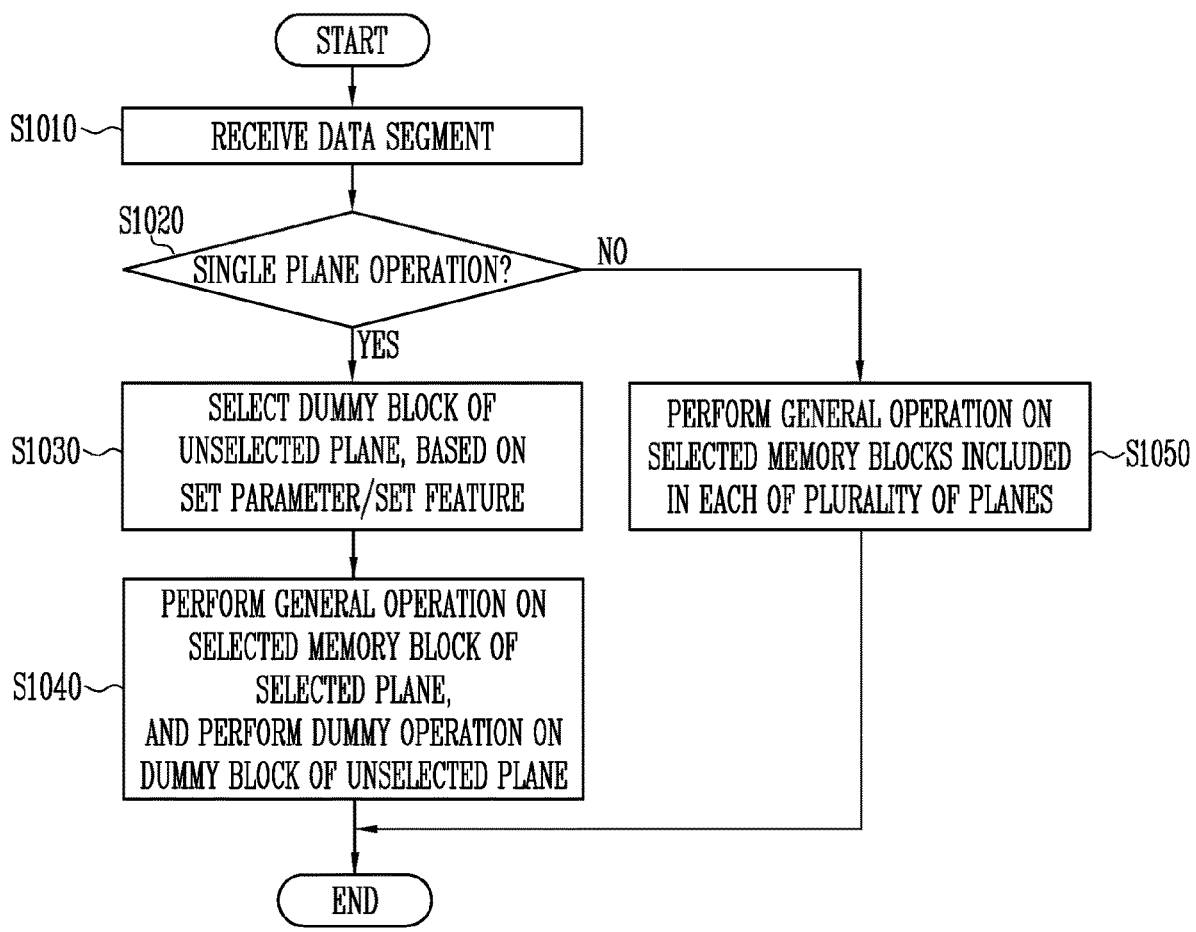
FIG. 10 illustrate an embodiment of a method for operating a semiconductor memory device.

FIG. 10 illustrates an embodiment of a method for operating a semiconductor memory device, and FIGS. 11 and 12 illustrate examples of data segments. The method embodiment may be described with reference to FIGS. 1 to 12. Also, in this embodiment, the memory cell array may include two planes and an operation is performed on one plane selected from the two planes in a single plane operation. Also, an operation is performed on both of the two planes in the memory cell array in a multi-plane operation.

In operation S1010, the semiconductor memory device 100 receives one or more data segments from the controller 1200. One data segment may be configured with a set parameter, an address ADD, data DATA, and a command CMD corresponding to a program operation, a read operation, or an erase operation. An example of such a data segment is shown in FIG. 11. When the command CMD corresponds to the read operation or the erase operation, the data segment may not include data DATA or may include invalid data. The set parameter may be a command corresponding to a parameter setting operation of the semiconductor memory device 100, and may include information indicating whether an operation of the semiconductor memory device 100 is to be performed as a single plane operation or is to be performed as a multi-plane operation.

Another data segment may be configured with a set feature, an address ADD, data DATA, and a command CMD corresponding to a program operation, a read operation, or an erase operation. An example of such a data segment is shown in FIG. 12. When the command CMD corresponds to the read operation or the erase operation, the data segment may not include data DATA or may include invalid data. The set feature may be a mode command indicating that an operation of the semiconductor memory device 100 is to be performed as a single plane operation or a multi-plane operation.

In operation S1020, control logic 300 of the semiconductor memory device 100 determines whether the operation is a single plane operation or a multi-plane operation according to the set parameter or the set feature of the received data segment. When it is determined that the operation is a single plane operation in S1020 (YES), then in operation S1030 the control logic 300 may select a dummy block MBj+1 of an unselected plane (e.g., second plane Plane 1), based on the set parameter or set feature.

In operation S1040, control logic 300 performs a program operation, a read operation, or an erase operation on a selected memory block (e.g., MB2) of a selected plane (e.g., first plane Plane 0) in response to the address ADD and the command CMD in the received data segment.

In a program operation, page buffers PB1 to PBm 231 corresponding to the selected memory block MB2 receive and temporarily store data DATA to be programmed, and may adjust the potential level of bit lines BL1 to BLm coupled to the selected memory block MB2, based on the temporarily stored data DATA. The voltage generating circuit 210 generates and outputs a program voltage and a pass voltage in response to an operation signal OP_CMD. The row decoder 220 performs the program operation by applying the program voltage and the pass voltage (which are generated by the voltage generating circuit 210) to word lines of the selected memory block MB2 of the first plane Plane 0 in response to row decoder control signals AD_signals.

In a read operation, the voltage generating circuit 210 generates and outputs a read voltage and a pass voltage in response to an operation signal OP_CMD. The row decoder 220 applies the read voltage and the pass voltage (which are generated by the voltage generating circuit 210) to the word lines of the selected memory block MB2 of the first plane Plane 0 in response to row decoder control signals AD_signals. The page buffers PB1 to PBm 231 corresponding to the selected memory block MB2 perform the read operation by sensing a voltage or current of the bit lines BL1 to BLm of the selected memory block MB2.

In an erase operation, the source line driver 270 applies an erase voltage to a source line SL of the selected memory block MB2 of the first plane Plane 0. The page buffers PB1 to PBm 231 corresponding to the selected memory block MB2 apply the erase voltage to the bit lines BL1 to BLm of the selected memory block MB2 or float the bit lines BL1 to BLm of the selected memory block MB2.

In the above-described operation of the selected memory block MB2 of the first plane Plane 0, control logic 300 controls the peripheral circuits 200 to perform a dummy operation on the dummy block MBj+1 of the unselected plane, e.g., the second plane Plane 1. For example, the peripheral circuits 200 perform a dummy program operation on the dummy block MBj+1 when the program operation on the selected memory block is performed, perform a dummy read operation on the dummy block MBj+1 when the read operation on the selected memory block MB2 is performed, and perform a dummy erase operation on the dummy block MBj+1 when the erase operation on the selected memory block MB2 is performed.

When it is determined that the operation is the multi-plane operation in operation S1020 (NO), in operation S1050 control logic 300 controls the peripheral circuits 200 to perform a program operation, a read operation, or an erase operation on the selected memory block (e.g., MB2) of the first plane Plane 0 and a selected memory block (e.g., MBk) of the second plane Plane 1, based on the set parameter or set feature.

In a program operation, the page buffers PB1 to PBm 231 corresponding to the selected memory block MB2 receive and temporarily store data DATA to be programmed, and may adjust a potential level of the bit lines BL1 to BLm coupled to the selected memory block MB2, based on the temporarily stored data DATA. In addition, page buffers PB1 to PBm 231 corresponding to the selected memory block MBk receive and temporarily store data DATA to be programmed, and may adjust a potential level of bit lines BL1 to BLm coupled to the selected memory block MBk, based on the temporarily stored data DATA.

The voltage generating circuit 210 generates and outputs a program voltage and a pass voltage in response to an operation signal OP_CMD. The row decoder 220 simultaneously performs the program operations respectively on the memory block MB2 and the memory block MBk by applying the program voltage and the pass voltage (which are generated by the voltage generating circuit 210) to each of the word lines of the selected memory block MB2 of the first plane Plane 0 and word lines of the selected memory block MBk of the second plane Plane 1 in response to row decoder control signals AD_signals.

In a read operation, the voltage generating circuit 210 generates and outputs a read voltage and a pass voltage in response to an operation signal OP_CMD. The row decoder 220 applies the read voltage and the pass voltage (which are generated by the voltage generating circuit 210) to each of the word lines of the selected memory block MB2 of the first plane Plane 0 and the word lines of the selected memory block MBk of the second plane Plane 1 in response to row decoder control signals AD_signals. The page buffers PB1 to PBm 231 corresponding to the selected memory block MB2 perform the read operation by sensing a voltage or current of the bit lines BL1 to BLm of the selected memory block MB2. The page buffers PB1 to PBm 231 corresponding to the selected memory block MBk perform the read operation by sensing a voltage or current of the bit lines BL1 to BLm of the selected memory block MBk.

In an erase operation, the source line driver 270 applies an erase voltage to the source line SL of the selected memory block MB2 of the first plane Plane 0 and a source line SL of the selected memory block MBk of the second plane Plane 1. The page buffers PB1 to PBm 231 corresponding to the selected memory block MB2 apply the erase voltage to the bit lines BL1 to BLm of the selected memory block MB2 or float the bit lines BL1 to BLm of the selected memory block MB2. The page buffers PB1 to PBm 231 corresponding to the selected memory block MBk apply the erase voltage to the bit lines BL1 to BLm of the selected memory block MBk or float the bit lines BL1 to BLm of selected memory block MBk.

In the above-described embodiment, a dummy operation is performed on an unselected plane in a single plane operation that corresponding to selecting one plane. In one embodiment, the dummy operation may be performed on all unselected planes among all planes in a general operation on at least one selected plane, when the memory cell array includes at least three planes.

FIG. 13 illustrates an example of performing a dummy operation on a dummy block of an unselected plane. The dummy operation on the dummy block may be described with reference to FIGS. 2, 3, and 13.

In a dummy program operation, a program voltage is applied to a word line WL of the dummy block. For example, the voltage generating circuit 210 of FIG. 2 may generate a program voltage in a program operation on a selected plane and a dummy program operation on an unselected plane during a single plane operation. The row decoder 220 may simultaneously apply the program voltage to a word line of a selected memory block of the selected plane and a word line of a dummy block of the unselected plane.

In addition, page buffers PB1 to PBm 231 corresponding to the dummy block of the unselected plane may apply a program inhibit voltage (e.g., Vcc) to bit lines BL1 to BLm of the dummy block. Therefore, although the program voltage is applied to the word line, the program inhibit voltage is applied to the bit lines BL1 to BLm, so that the dummy block of the unselected plane is not programmed. The source line driver 270 may apply a power voltage Vcc to a source line SL of the dummy block. In addition, the pass/fail check circuit 260 always outputs a pass signal PASS in a program status check operation during the dummy program operation on the dummy block.

In a dummy read operation or dummy verify operation, a read voltage or verify voltage may be applied to the word line WL of the dummy block. For example, the voltage generating circuit 210 of FIG. 2 may generate the read voltage or the verify voltage in a read operation or verify operation on the selected plane and a dummy read operation or dummy verify operation on the unselected plane during the single plane operation. The row decoder 220 may simultaneously apply the read voltage or verify voltage to the word line of the selected memory block of the selected plane and the word line of the dummy block of the unselected plane.

In addition, the page buffers PB1 to PBm 231 corresponding to the dummy block of the unselected plane prevents a cell current of the dummy block from flowing by applying 0V to the bit lines BL1 to BLm of the dummy block. Also, the page buffers PB1 to PBm 231 corresponding to the dummy block of the unselected plane may be set such that dummy data (e.g., "1") for the dummy read operation is stored. The dummy data may be output in a data output operation after the dummy read operation. In addition, the source line driver 270 may prevent a cell current from flowing by applying 0V to the source line SL of the dummy block.

In a dummy erase operation, an erase voltage is applied to the source line SL of the dummy block. For example, the source line driver 270 of FIG. 2 simultaneously applies the erase voltage to the source line SL of the selected memory block of the selected plane and the source line SL of the dummy block of the unselected plane, by generating the erase voltage in an erase operation on the selected plane and a dummy erase operation on the unselected plane during the single plane operation.

The page buffers PB1 to PBm 231 corresponding to the dummy block of the unselected plane may apply the erase voltage to the bit lines BL1 to BLm of the dummy block or float the bit lines BL1 to BLm of the dummy block.

The row decoder 220 floats the word line of the dummy block of the unselected plane. Therefore, the dummy block is not erased even when the erase voltage is applied to the source line SL and the bit lines BL1 to BLm of the dummy block of the unselected plane. In addition, in one embodiment, the pass/fail check circuit 260 may always output the pass signal PASS in an erase status check operation during the dummy erase operation on the dummy block.

As described above, in accordance with one or more embodiments, an operation on the selected memory block of the selected plane and a dummy operation on the dummy block of the unselected plane may be simultaneously performed in the single plane operation. The selected plane and the unselected plane may simultaneously operate in the single plane operation, so that an operating voltage characteristic similar to that of the multi-plane operation can be obtained.

Figure 14:
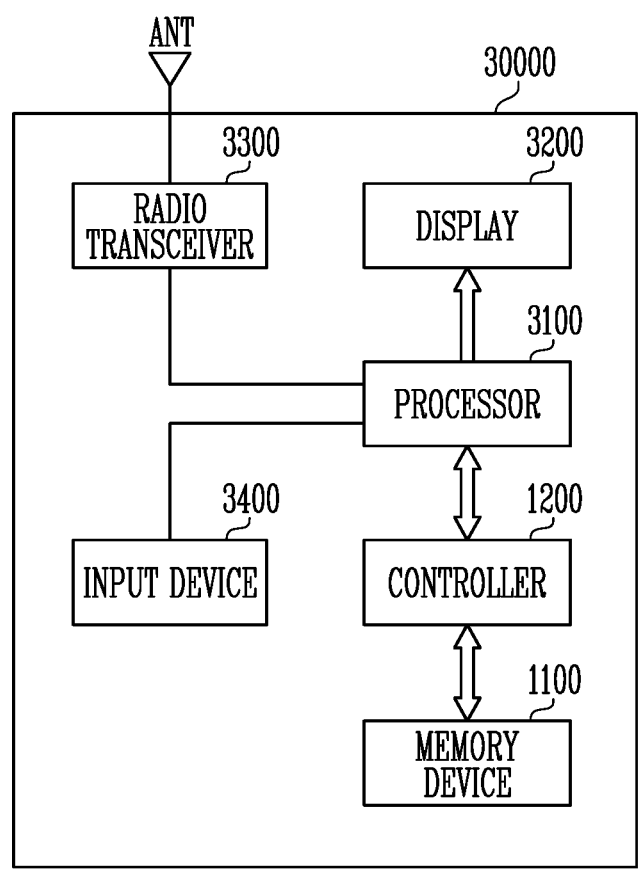
FIG. 14 illustrates an embodiment of a memory system.

FIG. 14 illustrates an embodiment of a memory system 30000 that may be implemented, for example, in correspondence with a cellular phone, a smart phone, a tablet PC, a personal digital assistant (PDA), or a wireless communication device.

Referring to FIG. 14, the memory system 30000 may include a memory device and a controller (such as the memory device 1100 and the controller 1200 of FIG. 1) capable of controlling an operation of the memory device 1100. The controller 1200 may control a data access operation of the memory device 1100, e.g., a program operation, an erase operation, a read operation, or the like under the control of a processor 3100.

Data programmed in the memory device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100.

Also, the radio transceiver 3300 may change a signal output from the processor 3100 into a radio signal and output the changed radio signal to an external device through the antenna ANT. An input device 3400 is capable of inputting a control signal for controlling operation of the processor 3100 or data to be processed by the processor 3100. The input device may include a pointing device such as a touch pad or a computer mount, a keypad, or a keyboard. The processor 3100 may control operation of the display 3200 such that data output from the controller 1200, data output from the radio transceiver 3300, or data output from the input device 3400 is output through the display 3200.

In some embodiments, the controller 1200, which is capable of controlling operation of the memory device 1100, may be implemented as part of the processor 3100 or may be implemented as a chip separate from the processor 3100.

Figure 15:
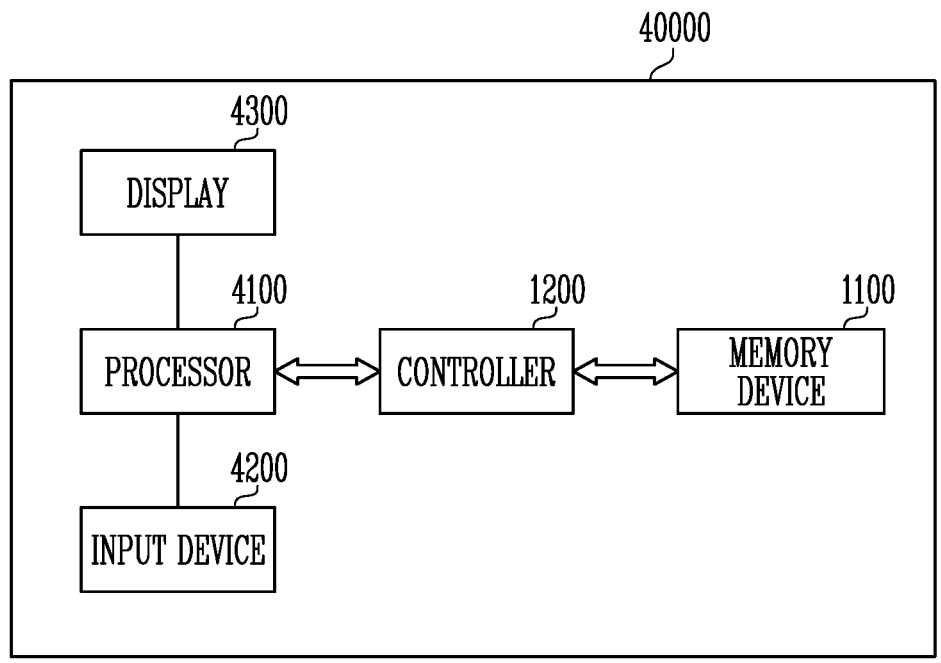
FIG. 15 illustrates an embodiment of a memory system.

FIG. 15 illustrates an embodiment of a memory system 40000, which, for example, may be implemented in correspondence with a personal computer (PC), a tablet PC, a net-book, an e-reader, a personal digital assistant (PDA), a portable multi-media player (PMP), an MP3 player, or an MP4 player.

Referring to FIG. 15, the memory system 40000 may include a memory device and a controller (such as the memory device 1100 and the controller 1200 of FIG. 1) capable of controlling a data processing operation of the memory device 1100. A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000 and may control operation of the controller 1200. In some embodiments, the controller 1200, which is capable of controlling operation of the memory device 1100, may be implemented as part of the processor 4100 or may be implemented as a chip separate from the processor 4100.

Figure 16:
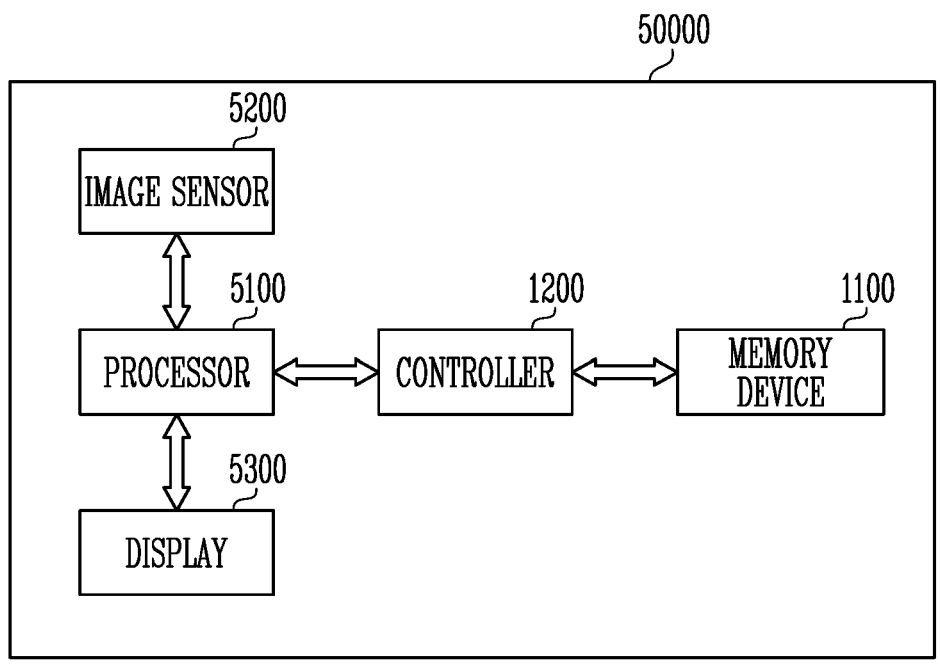
FIG. 16 illustrates an embodiment of a memory system.

FIG. 16 illustrates an embodiment of a memory system 50000, which, for example, may be implemented in correspondence with an image processing device, e.g., a digital camera, a mobile terminal having a digital camera attached thereto, a smart phone having a digital camera attached thereto, or a tablet PC having a digital camera attached thereto.

The memory system 50000 may include a memory device and a controller (such as the memory device 1100 and the controller 1200 of FIG. 1) capable of controlling a data processing operation of the memory device 1100, e.g., a program operation, an erase operation, or a read operation. In operation, an image sensor 5200 of the memory system 50000 may convert an optical image into digital signals, and the converted digital signals may be transmitted to a processor 5100 or the controller 1200. Under the control of the processor 5100, the converted digital signals may be output through a display 5300 or may be stored in the memory device 1100 through the controller 1200. In addition, data stored in the memory device 1100 may be output through the display 5300 under the control of the processor 5100 or the controller 1200.

In some embodiments, the controller 1200 capable of controlling an operation of the memory device 1100 may be implemented as part of the processor 5100 or may be implemented as a chip separate from the processor 5100.

Figure 17:
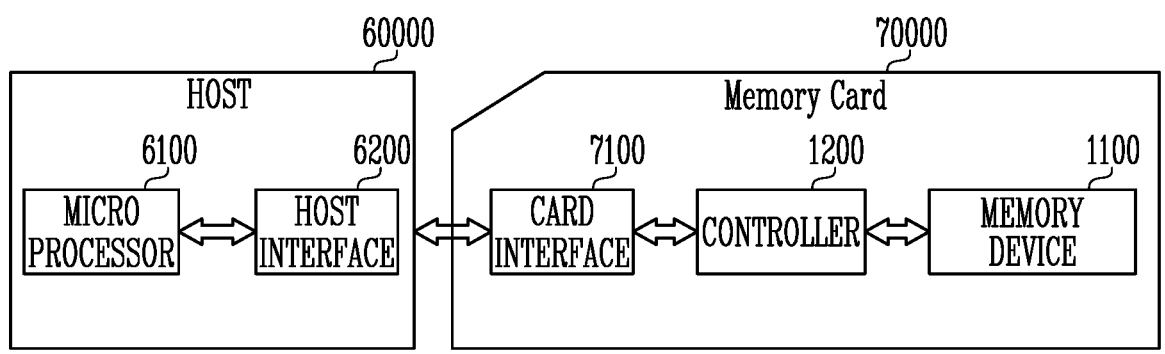
FIG. 17 illustrates an embodiment of a memory system.

FIG. 17 illustrates an embodiment of a memory system 70000, which, for example, may be implemented as a memory card or a smart card. The memory system 70000 may include a memory device and a controller (such as the memory device 1100 and the controller 1200 of FIG. 1), and a card interface 7100. The controller 1200 may control data exchange between the memory device 1100 and the card interface 7100. In some embodiments, the card interface 7100 may be a secure digital (SD) card interface, a multi-media card (MMC) interface, or another type of interface.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may include hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, video game console, or a digital set-top box, the host interface 6200 may perform data communication with the memory device 1100 through the card interface 7100 and the controller 1200 under the control of a microprocessor 6100.

In accordance with one or more of the aforementioned embodiments, a semiconductor memory device includes a plurality of planes that attain uniform operating voltage characteristics regardless of the number of selected planes.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the various embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device, comprising:
a memory cell array including at least two planes; and
a peripheral circuit configured to perform a memory operation on a selected plane of the at least two planes during a single plane operation and to perform a dummy operation on an unselected plane of the at least two planes.

2. The semiconductor memory device of claim 1, further comprising:
control logic configured to control the peripheral circuit to perform the single plane operation or a multi-plane operation based on a set feature or a set parameter, wherein the multi-plane operation includes simultaneously performing the memory operation on the at least two planes in the memory cell array.

3. The semiconductor memory device of claim 1, wherein each of the at least two planes includes a plurality of normal blocks and at least one dummy block.

4. The semiconductor memory device of claim 3, wherein the peripheral circuit performs a dummy program operation on the unselected plane in a program operation performed on the selected plane during the single plane operation.

5. The semiconductor memory device of claim 4, wherein the peripheral circuit applies a program voltage and a pass voltage to word lines of the dummy block of the unselected plane in the dummy program operation performed on the unselected plane.

6. The semiconductor memory device of claim 4, wherein the peripheral circuit applies a program inhibit voltage to bit lines of the dummy block of the unselected plane and applies a power voltage to a source line of the dummy block of the unselected plane in the dummy program operation on the unselected plane.

7. The semiconductor memory device of claim 3, wherein the peripheral circuit performs a dummy read operation on the unselected plane in a read operation performed on the selected plane during the single plane operation.

8. The semiconductor memory device of claim 7, wherein the peripheral circuit applies a read voltage and a pass voltage to the word lines of the dummy block of the unselected plane in the dummy read operation performed on the unselected plane.

9. The semiconductor memory device of claim 7, wherein the peripheral circuit applies a reference voltage to the bit lines and the source line of the dummy block of the unselected plane in the dummy read operation performed on the unselected plane.

10. The semiconductor memory device of claim 3, wherein the peripheral circuit performs a dummy erase operation on the unselected plane in an erase operation performed on the selected plane during the single plane operation.

11. The semiconductor memory device of claim 10, wherein the peripheral circuit applies an erase voltage to the source line and the bit lines of the dummy block of the unselected plane in the dummy erase operation performed on the unselected plane.

12. The semiconductor memory device of claim 10, wherein the peripheral circuit floats the word lines of the dummy block of the unselected plane in the dummy erase operation performed on the unselected plane.

* * * * *